US006738940B1

(12) United States Patent
Hummel et al.

(10) Patent No.: US 6,738,940 B1
(45) Date of Patent: May 18, 2004

(54) INTEGRATED CIRCUIT INCLUDING A TEST SIGNAL GENERATOR

(75) Inventors: Ulrich Helmut Hummel, Teningen (DE); Jonathan Bradford, Freiburg (DE)

(73) Assignee: Micronas GmbH, Freiburg (DE)

( * ) Notice: Subject to any disclaimer, the term of this patent is extended or adjusted under 35 U.S.C. 154(b) by 0 days.

(21) Appl. No.: 09/674,413

(22) PCT Filed: Apr. 27, 1999

(86) PCT No.: PCT/EP99/02821

§ 371 (c)(1),
(2), (4) Date: Dec. 26, 2000

(87) PCT Pub. No.: WO99/57569

PCT Pub. Date: Nov. 11, 1999

(30) Foreign Application Priority Data

Apr. 30, 1998 (DE) .......................................... 198 19 264

(51) Int. Cl.[7] ........................... G01R 31/28; G06F 11/00
(52) U.S. Cl. ....................... 714/740; 714/728; 714/739
(58) Field of Search ................................ 714/739, 728, 714/740; 708/252

(56) References Cited

U.S. PATENT DOCUMENTS

| 3,783,254 | A | * | 1/1974 | Eichelberger | ................ | 708/100 |
| 4,357,703 | A | | 11/1982 | Van Brunt | .................... | 371/15 |
| 4,670,877 | A | | 6/1987 | Nishibe | ........................ | 371/15 |
| 4,687,988 | A | * | 8/1987 | Eichelberger et al. | ...... | 324/73.1 |
| 4,847,800 | A | | 7/1989 | Daane | ......................... | 364/717 |
| 5,404,358 | A | * | 4/1995 | Russell | ........................ | 714/727 |
| 5,796,746 | A | * | 8/1998 | Farnworth et al. | ........... | 714/718 |
| 5,898,703 | A | * | 4/1999 | Lin | ............................. | 714/726 |
| 5,930,270 | A | * | 7/1999 | Forlenza et al. | ............. | 714/736 |
| 5,938,784 | A | * | 8/1999 | Kim | ............................ | 714/733 |
| 5,974,578 | A | * | 10/1999 | Mizokawa et al. | .......... | 714/727 |

FOREIGN PATENT DOCUMENTS

JP          8105947          4/1996

OTHER PUBLICATIONS

Miron Abramovici, Melvin A. Breuer and Arthur D. Friedman, "Digital Systems Testing and Testable Design", rev. ed., IEEE press, 1990.*
Agrawai et al. "Built–in self–test for digital integrated circuits", AT&T Technical Journal, Mar.–Apr. 1994.

* cited by examiner

*Primary Examiner*—Albert Decady
*Assistant Examiner*—Joseph D. Torres
(74) *Attorney, Agent, or Firm*—Gauthier & Connors LLP

(57) ABSTRACT

An integrated circuit (IC) includes a first lead, a second lead and a sensor element that provides a sensed signal. The IC also includes a test signal generator that provides a test signal, a signal processing unit, and a switching device that selectively applies the sensed signal or the test signal to the signal processing unit in response to a command signal, wherein the signal processing unit provides processed data. In response to a test command input signal, the IC generates the command signal, wherein when the test input signal is active the command signal is set to command the switching device to input the test signal to the signal processing unit. A check sum calculator receives the processed data and provides a signal indicative of a check sum value on the second lead when the command signal is set to command the switching device to input the test signal to the signal processing unit.

11 Claims, 2 Drawing Sheets

INTEGRATED CIRCUIT INCLUDING A TEST SIGNAL GENERATOR

BACKGROUND OF THE INVENTION

The invention relates to the field of automatic testing of electronic components, and in particular to the field of testing integrated circuits.

Quality control of electric components and process control of production machines are extremely important in the production of integrated circuits, in order to assure that the components delivered by the manufacturer meet the requirements of the customer. Rational quality control of electric components includes not only testing of their electric properties, especially the access times of memory components, but also the checking for visible external defects. The electric properties of components are now being tested by automatic test equipment at the end of the production line.

The nature of the production process for electric components makes it impossible to guarantee 100% freedom from defects. After the production process, it is therefore necessary to test the component.

Testing techniques include measuring the analog characteristics of the finished electric component. It is also possible to apply digital test patterns to the terminals of the integrated circuit or of the electric component, and then to analyze the reactions.

The measurement of analog characteristics has the disadvantage that it is relatively time-consuming, if the digital signal processing unit in the integrated circuit configuration is to be tested. Adjustable components require a number of measurements with different settings. If an electric component actually has a defect, it is very difficult to localize this defect by measuring the analog characteristics.

The method of applying digital test patterns to the electric component and then analyzing the reaction of the component has the disadvantage that conventional test devices, so-called ASIC testers, operate synchronously with the electric component. As a result, an oscillator integrated within the integrated circuit that is being tested must be turned off or deactivated, because the test clock pulse is applied to a terminal of the integrated circuit.

Therefore, there is a need for improved testing of an integrated circuit, which quickly delivers a reliable test result to distinguish whether or not the integrated circuit is defective.

SUMMARY OF THE INVENTION

A pseudo-random-check generator inside a integrated circuit delivers a plurality of digital test data, each of which is processed in a digital signal processing device within the integrated circuit and which, after being processed are each conducted to a test sum calculator. The test sum calculator performs a polynomial calculation and adds up a test sum from the individual calculated results. The calculated test sum is used as the criterion for the absence of defects in the integrated circuit configuration. If the test sum deviates from the prescribed test sum, this indicates that the digital signal processing device in the integrated circuit configuration is defective.

To test the integrated circuit, a start command is applied to the integrated circuit causing a switch-over device inside the integrated circuit to connect a digital signal processing unit to the pseudo-random-check generator. Then the digital signal processing unit is reset and the pseudo-random-check generator is started. Also, the test sum calculator preferably was previously reset to 0. The individual digital data delivered by the signal generator are processed in the digital signal processing unit, and the processed digital signal is conducted to the test sum calculator. This is done for every signal present at the output of the pseudo-random-check generator. After the pseudo-random-check generator has delivered a prescribed number of output data, it is stopped, and finally a test sum is made available at the output of the test sum calculator. This test sum is conducted, via an interface unit, to an output terminal of the integrated circuit configuration, and is there queried. Preferably it is queried by a protocol generator connected to a control computer. Finally, the switch-over device is again reset to normal operation.

In normal operation, an analog circuit section which can contain, for example, a sensor, especially a Hall sensor, is connected to the digital signal processing unit.

The advantages of this method is the relatively short measurement time which it needs to determine whether or not the integrated circuit is defective. The integrated circuit itself must include only few additional hardware components, mainly the switch-over device, the pseudo-random-check generator, and the test sum calculator, as well as the process control.

If the already existing terminals of the integrated circuit configuration are used as the signal input and output terminals for the test mode, this has the advantage that no additional terminals need to be furnished for the test mode. The reliability of the integrated circuit configuration is thus markedly improved, compared to other circuit configurations with several terminals.

These and other objects, features and advantages of the present invention will become more apparent in light of the following detailed description of preferred embodiments thereof, as illustrated in the accompanying drawings.

DETAILED DESCRIPTION OF THE INVENTION

Figure 1:
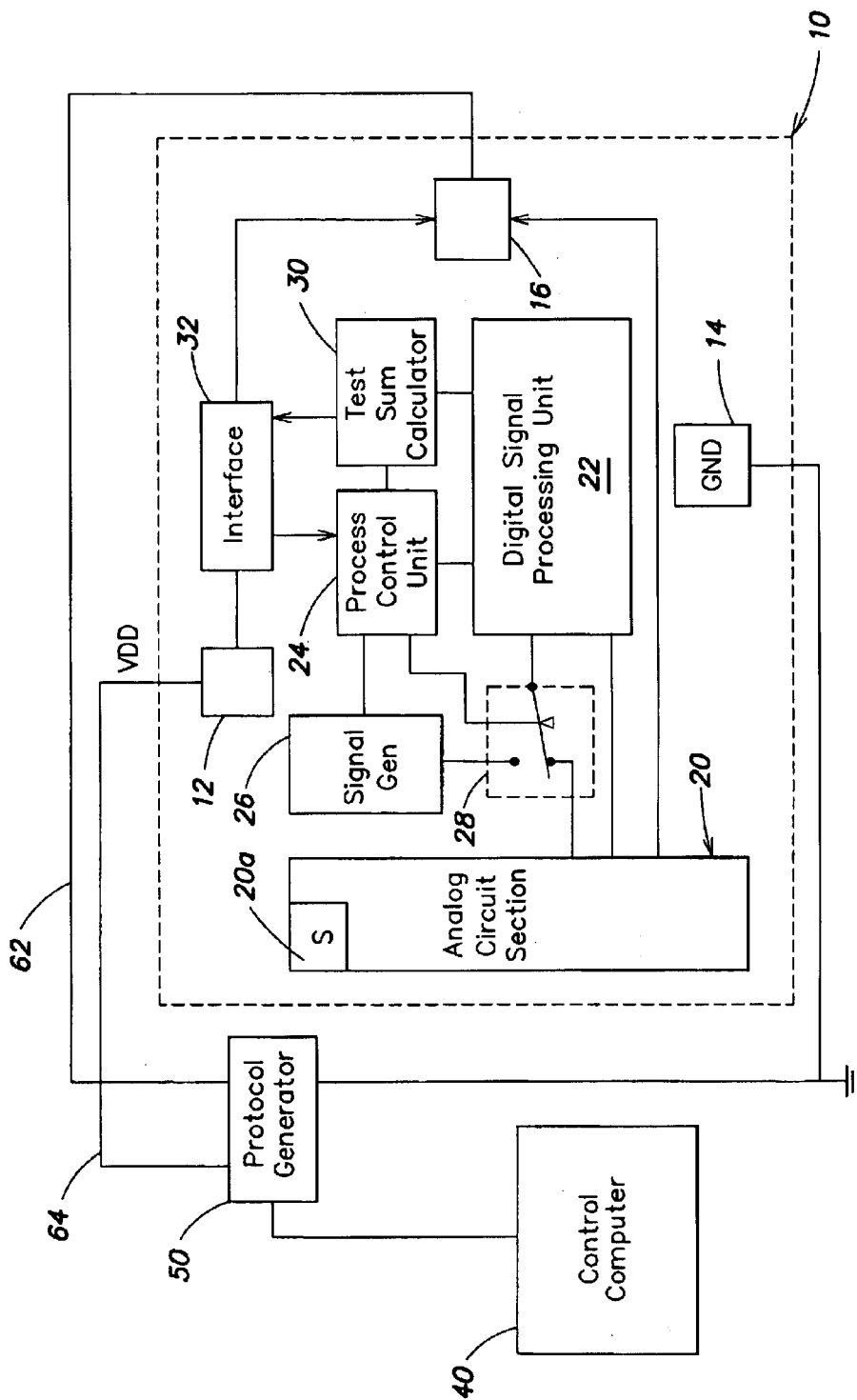
FIG. 1 illustrates a circuit block diagram of an integrated circuit that is connected via a protocol generator to a control computer.

FIG. 1 shows a circuit block diagram of an integrated circuit 10. The integrated circuit has three terminals, namely a supply voltage connection 12, a reference potential connection 14, and an analog output terminal 16. The integrated circuit 10 also includes an analog circuit section 20, which can contain, for example, a sensor (e.g., a Hall sensor 20a). A digital signal processing unit 22 is connected to the analog circuit section 20. The analog circuit section 20 is also connected to the output terminal 16.

An important component of the integrated circuit 10 is a switch-over device 28, which is controlled by a process control unit 24. The switch-over device 28 connects the analog circuit section 20 to the digital signal processing unit 22, or alternatively, instead of switching the analog circuit section 20, it switches a pseudo-random-check generator 26 to the input of the digital signal processing unit 22. For this purpose, the process control unit 24 is connected to the digital signal processing unit 22.

The process control unit 24 is also in contact with an interface unit 32. The interface unit 32 is connected between the supply voltage terminal 12 and the analog output terminal 16 and it conducts the input signals to the process control unit 24. The integrated circuit configuration 10 also contains a test sum calculator 30, that receives the digital signals processed by the digital signal processing unit 22 and calculates the test sum from these signals. The test sum passes through the interface unit 32 to the analog output terminal 16.

The integrated circuit 10 is connected via a protocol generator 50 to a control computer 40. The protocol generator 50, is connected by a first line 64 to the supply voltage terminal 12, and by a second line 642 to the analog output terminal 16. The protocol generator 50 and the reference potential terminal 14 of the integrated circuit 10 are both connected to the reference potential.

The protocol generator 50 provides a data stream to the integrated circuit 10. Among other purposes, this data stream initiates a test mode of the integrated circuit 10. The data stream present at the analog output terminal 16 is also conducted to the protocol generator 50, which demodulates this data stream.

Figure 2:
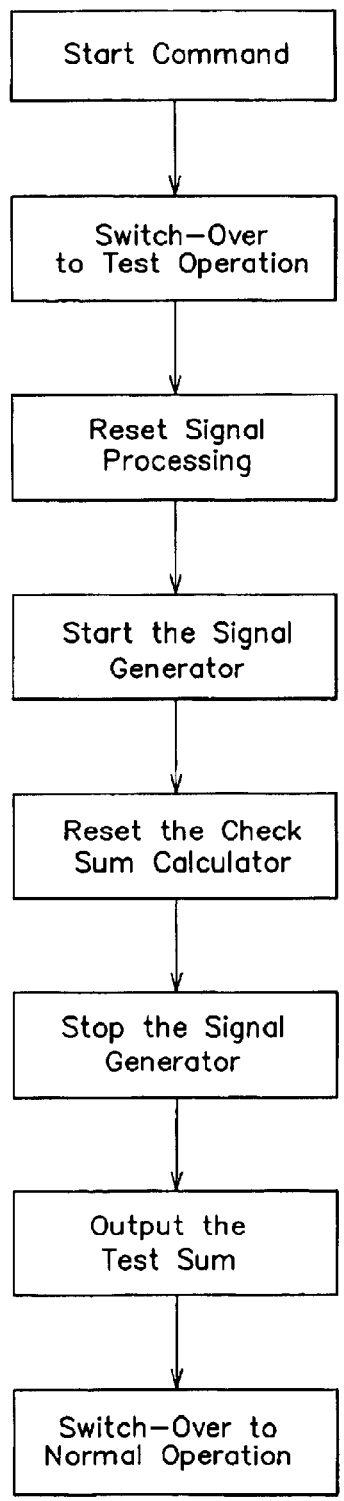
FIG. 2 shows a process diagram of a test mode of the integrated circuit of FIG. 1.

The mode in which the circuit configuration of FIG. 1 functions is explained in more detail in connection with the process diagram of FIG. 2. The control computer 40 first informs the protocol generator 50 that a test mode is to be initiated. In response, the protocol generator 50 generates a suitable start command that is conducted, via the supply voltage terminal 12 and the interface unit 32 to the process control unit 24. After detecting this start command, the process control unit 24 commands the switch-over device 28 from its "normal setting," as this is shown in FIG. 1, to the "test mode setting".

In the "test mode setting" the switch-over device 28 connects the pseudo-random-check generator 26 to the input of the digital signal processing device 22. At the same time, the process control unit 24 resets the pseudo-random-check generator 26, the digital signal processing device 22, and the test sum calculator 30. The pseudo-random-check generator 26 thereupon generates a plurality of digital signal data, which are sequentially conducted to and processed by the digital signal processing device 22. For each digital value received from the pseudo-random-check generator 26, the digital signal processing device 22 generates an associated output value. The test sum calculator 30 performs a polynomial calculation for each output value developed by the digital signal processing device 22, and the result of this polynomial calculation is conducted to an adder stage. The adder stage sums the plurality of values subjected to the polynomial calculation, and from this forms a single test sum. This test sum at the output of the test sum calculator 30 is conducted, via the interface unit 32, to the analog output terminal 16 and is analyzed by the protocol generator 50 and the control computer 40.

If the test sum corresponds to a prescribed value, this constitutes a criterion that the digital signal processing device 22 operates correctly and that accordingly the integrated circuit configuration 10 is intact to this extent. On the other hand, if the test sum does not correspond to the prescribed value, this indicates that at least the digital signal processing device 22 of the circuit configuration 10 is defective.

At the end of the test mode, the process control unit 24 makes sure that the switch-over device 28 is reset to normal operation, as shown in FIG. 1. In normal operation, the pseudo-random-check generator 26 is halted.

The circuit configuration shown in FIG. 1 advantageously uses the terminals 12, 14 and 16, which are already present in the integrated circuit 10, also for the test mode. Therefore no additional connection pins are required for the test mode. Finally, another advantage is that the interface unit 32, which is already contained in the integrated circuit configuration 10, is also used.

Although the present invention has been shown and described with respect to several preferred embodiments thereof, various changes, omissions and additions to the form and detail thereof, may be made therein, without departing from the spirit and scope of the invention.

What is claimed is:

1. An integrated circuit, comprising a process control device, a switch-over device, a pseudo-random-check generator, an analog circuit section, a digital signal processing unit, and a check sum calculator connected between the output of the digital signal processing unit and an output terminal of the integrated circuit, such that the switch-over device can switch either the analog circuit section or the pseudo-random-check generator to input data to the digital signal processing unit, wherein an interface unit, which is connected between a supply terminal and an output terminal of the integrated circuit, is also connected to the process control device and the check sum calculator.

2. The integrated circuit claim 1, wherein the output terminal comprises a terminal from which an analog signal of the integrated circuit is tapped.

3. The integrated circuit of claim 2, comprising a sensor.

4. The integrated circuit of claim 1, wherein said check sum calculator includes a polynomial calculation device and an adder stage.

5. An integrated circuit, comprising
   a first lead, and a second lead;
   a sensor element that provides a sensed signal;
   a test signal generator that provides a test signal;
   a signal processing unit;
   a switching device that selectively applies said sensed signal or said test signal to said signal processing unit in response to a command signal, wherein said signal processing unit provides processed data;
   means, responsive to a test command input signal, for generating said command signal, wherein when said test input signal is active said command signal is set to command said switching device to input said test signal to said signal processing unit; and
   a check sum calculator that receives said processed data and provides a signal indicative of a check sum value on said second lead when said command signal is set to command said switching device to input said test signal to said signal processing unit.

6. The integrated circuit of claim 5, wherein said sensor element comprises a Hall effect sensing device.

7. The integrated circuit of claim 6, wherein said check sum calculator performs a polynomial calculation on each processed data, and sums individual results from the polynomial calculation to form said check sum value.

8. The integrated circuit of claim 5, wherein said test signal generator comprises a pseudo random check generator such that said test signal comprises a pseudo random signal.

9. The integrated circuit of claim 5, wherein said check sum value is output on said second lead of said integrated circuit.

10. The integrated circuit of claim 5, wherein said means for generating comprises an interface that receives said test command signal and provides a signal indicative thereof to a process control unit that generates said command signal.

11. The integrated circuit of claim 10, wherein in a first state said command signal commands said switching device to couple said test signal to said signal processing unit, and in a second state said command signal commands said switching device to couple said sensed signal to said signal processing unit.

* * * * *

UNITED STATES PATENT AND TRADEMARK OFFICE
CERTIFICATE OF CORRECTION

PATENT NO.     : 6,738,940 B1
DATED          : May 18, 2004
INVENTOR(S)    : Hummel et al.

It is certified that error appears in the above-identified patent and that said Letters Patent is hereby corrected as shown below:

Column 2,
Line 23, after "only" insert -- a --

Column 3,
Line 14, delete "642" and insert -- 62 --
Line 33, after "setting" delete ","
Line 33, after "as" delete "this is"

Signed and Sealed this

Twenty-fifth Day of January, 2005

JON W. DUDAS
*Director of the United States Patent and Trademark Office*